(12) United States Patent
Zhang et al.

(10) Patent No.: US 8,927,648 B2
(45) Date of Patent: Jan. 6, 2015

(54) SURFACE MODIFICATION OF PIGMENTS AND COMPOSITIONS COMPRISING THE SAME

(71) Applicant: Cabot Corporation, Boston, MA (US)

(72) Inventors: Qingling Zhang, Billerica, MA (US); Lynne K. LaRochelle Richard, Littleton, MA (US)

(73) Assignee: Cabot Corporation, Boston, MA (US)

(*) Notice: Subject to any disclaimer, the term of this patent is extended or adjusted under 35 U.S.C. 154(b) by 66 days.

(21) Appl. No.: 13/796,379

(22) Filed: Mar. 12, 2013

(65) Prior Publication Data

US 2013/0295501 A1    Nov. 7, 2013

Related U.S. Application Data

(60) Provisional application No. 61/642,553, filed on May 4, 2012.

(51) Int. Cl.

| | | |
|---|---|---|
| *C08G 67/02* | (2006.01) | |
| *C08K 9/00* | (2006.01) | |
| *C08G 63/91* | (2006.01) | |
| *C09C 1/48* | (2006.01) | |
| *C09D 5/00* | (2006.01) | |
| *C09D 11/322* | (2014.01) | |
| *C09D 11/324* | (2014.01) | |
| *C09D 11/52* | (2014.01) | |
| *C09B 67/00* | (2006.01) | |
| *G03F 7/00* | (2006.01) | |
| *C09C 1/56* | (2006.01) | |

(52) U.S. Cl.
CPC . *C08G 63/91* (2013.01); *C09C 1/48* (2013.01); *C09D 5/00* (2013.01); *C09D 11/322* (2013.01); *C09D 11/324* (2013.01); *C09D 11/52* (2013.01); *C09B 68/20* (2013.01); *C09B 68/44* (2013.01); *C09B 68/443* (2013.01); *C09B 68/446* (2013.01); *G03F 7/0007* (2013.01); *C09C 1/56* (2013.01); *C01P 2002/86* (2013.01); *C01P 2002/87* (2013.01); *C01P 2004/30* (2013.01); *C01P 2004/54* (2013.01); *C01P 2004/64* (2013.01); *C01P 2006/12* (2013.01); *C01P 2006/16* (2013.01)
USPC .......................................... 524/612; 523/200

(58) Field of Classification Search
USPC .......................................... 523/200; 524/612
See application file for complete search history.

(56) References Cited

U.S. PATENT DOCUMENTS

| | | | |
|---|---|---|---|
| 6,723,783 B2 | 4/2004 | Palumbo et al. | |
| 7,005,461 B2 | 2/2006 | Sanada et al. | |
| 7,294,185 B2 | 11/2007 | Belmont et al. | |
| 7,563,842 B2 | 7/2009 | Ma et al. | |
| 7,893,152 B2 | 2/2011 | Palumbo et al. | |
| 7,906,590 B2 | 3/2011 | Lee et al. | |
| 2010/0044652 A1* | 2/2010 | Kawaharada et al. | ........ 252/586 |
| 2010/0323289 A1 | 12/2010 | Carroll et al. | |

FOREIGN PATENT DOCUMENTS

| | | |
|---|---|---|
| EP | 1 840 172 | 10/2007 |
| EP | 2 083 289 | 7/2009 |
| JP | S59155418 | 9/1984 |
| JP | S59155419 | 9/1984 |
| WO | WO 02/21201 | 3/2002 |
| WO | WO 2010/040111 | 4/2010 |

OTHER PUBLICATIONS

International Search Report and the Written Opinion of the International Search Authority, or the Declaration of International Patent Application No. PCT/US2013/039381, mailed on Feb. 17, 2014.
Lin et al., A Novel Method for Grafting Polymers on Carbon Blacks, J. Mater Chem, 8 (10), 1998, p. 2169-2173.
Swamy et al., Mitsunobu and Related Reactions: Advances and Applications, Chem. Rev., 109, 2009, p. 2551-2651.
Tsubokawa et al., Grafting onto Carbon Black by the Reaction of Reactive Carbon Black Having Masked Isocyanate or Acyl Azide Group with Functional Polymers, J. Polym. Sci: Part A: Polymer Chemistry, vol. 26, 1988, p. 223-233.
Tsubokawa et al., Grafting onto Carbon Black: Reaction of Urethane Prepolymer with Carbon Black Surface, J. Polym. Sci., Polymer Chem. Ed., vol. 20, Issue 7, 1982, p. 1943-1946.
Tsubokawa et al., Grafting Reaction of Surface Carboxyl Groups on Carbon Black with Polymers Having Terminal Hydroxyl or Amino Groups Using N, N'-dicyclohexlcarbodiimide as a Condensing Agent, Reactive & Functional Polymers, vol. 27, 1995, p. 75-81.
Abstract only of JPH0443365, published Feb. 13, 1992, Konishiroku Photo Ind.

\* cited by examiner

*Primary Examiner* — Alexander Kollias (57) ABSTRACT

Disclosed herein is a method of making a modified pigment, comprising: reacting, under Mitsunobu conditions: (a) a first reactant comprising a protonated nucleophile having a $pK_a<15$, and (b) a second reactant comprising a hydroxyl-containing organic group, wherein a pigment is attached to either the first or second reactant. The method further comprises forming the modified pigment having attached an organic species comprising the nucleophile bonded to the organic group, with the net elimination of a proton and a hydroxyl. Also disclosed herein are modified pigments, which can have applications in chemical toners, inkjet ink and electrophoretic ink compositions, black matrix materials, color filters, and coatings.

12 Claims, 2 Drawing Sheets

SURFACE MODIFICATION OF PIGMENTS AND COMPOSITIONS COMPRISING THE SAME

CROSS REFERENCE TO RELATED APPLICATIONS

This patent application claims the benefit of U.S. Provisional Patent Application No. 61/642,553, filed May 4, 2012, the entire contents of which are incorporated herein by reference.

FIELD OF THE INVENTION

Disclosed herein are modified pigments having attached organic species, methods for making the modified pigments, and compositions comprising modified pigments.

BACKGROUND

Pigments find uses in many applications, including chemical toners, inkjet ink and electrophoretic ink compositions, black matrix materials, color filters, and coatings. Often pigments are dispersed in a vehicle, and may be combined with various additives and/or cosolvents. The chemistry of pigment surfaces vary widely and can be modified to achieve desired performance properties, e.g., dispersibility, hydrophobicity/hydrophilicity, etc. While methods have been developed for modifying pigment surfaces, many of these previous methods are less effective for certain surfaces and/or modifying agents. Accordingly, there remains a continual need to develop methods for modifying pigment surfaces.

SUMMARY

One embodiment provides a method of making a modified pigment, comprising:
reacting, under Mitsunobu conditions:
(a) a first reactant comprising a protonated nucleophile having a $pK_a<15$, and
(b) a second reactant comprising a hydroxyl-containing organic group, wherein a pigment is attached to either the first or second reactant, and
forming the modified pigment having attached an organic species comprising the nucleophile bonded to the organic group, with the net elimination of a proton and a hydroxyl.

Another embodiment provides a modified pigment comprising a pigment attached to an organic group via an —N—C— bond, wherein the nitrogen atom of the —N—C— bond is native to the pigment and the carbon atom of the —N—C— bond, and substituents thereof, are not native to the pigment prior to modification.

A modified pigment comprising an organic pigment attached to an organic group via an —O—C— bond, wherein the —O—C— bond forms phenolate or naphtholate linkages, and wherein the phenolate or naphtholate linkages have aromatic groups that are native to the pigment, and wherein the carbon atom of the —O—C— bond, and substituents thereof, are not native to the pigment prior to modification.

DETAILED DESCRIPTION

Pigments are generally insoluble in solvents as particulates, and thus present challenges in surface functionalization. Disclosed herein is the discovery that the Mitsunobu reaction can be performed on pigments to modify the pigment surface with a variety of organic species.

Generally, the Mitsunobu reaction is used to substitute alcohols (e.g., primary or secondary) with nucleophiles in the presence of reagents such as trialkyl- or triaryl phosphines and azodicarboxylate esters/amides. A general reaction scheme for the Mitsunobu reaction is depicted below:

It is believed that the reagents of the Mitsunubo reaction and/or reactive intermediates derived from these reagents cause the removal (e.g., deprotonation) of the acidic proton from the protonated nucleophile and net removal of a hydroxyl from the alcohol, leading to a reaction product comprising the nucleophile bonded to the organic compound. (See Swarmy et al., Chem. Rev. 109:2551, 2009).

While it has proven difficult to extend many solution-based organic reactions to pigment surfaces, it has been discovered that the Mitsunobu reaction can be used to attach nucleophiles or alcohols, thereby functionalizing or treating the pigments. Accordingly, one embodiment provides a method of making a modified pigment, comprising:
reacting, under Mitsunobu conditions;
(a) a first reactant comprising a protonated nucleophile having a $pK_a<15$, and
(b) a second reactant comprising a hydroxyl-containing organic group, wherein a pigment is attached to either the first or second reactant, and
forming the modified pigment having attached an organic species comprising the nucleophile bonded to the organic group, with the net elimination of a proton and a hydroxyl.

"Organic" groups or species, as used herein refer to carbon-based small molecules and polymers, as understood in the art, as well as silyl- and siloxy-containing molecules or polymers. "Pigment," as used herein, refers to particulate coloring agents that are insoluble in aqueous solution or organic solvents. "Polymers" refers to molecules containing at least 4 repeat units. Conversely, "small molecules" contain 3 or less repeat units.

In one embodiment, an attached group can be distinguished from an adsorbed group in that a soxhlet extraction for several hours (e.g., at least 4, 6, 8, 12, or 24 hours) will not remove the attached group from the pigment. In another embodiment, the organic group is attached to the pigment if the organic group cannot be removed after repeated washing with a solvent or solvent mixture that can dissolve the starting organic treating material but cannot disperse the treated pigment. In yet another embodiment, "attached" refers to a bond such as a covalent bond, e.g., a pigment bonded or covalently bonded to a nucleophile or organic group. In one embodiment, the nucleophile or organic group is attached either directly (bonding to a native atom of the pigment) or indirectly via an intermediary or spacer group. In one embodiment, the intermediary or spacer group is selected from substituted and unsubstituted $C_1$-$C_{12}$ alkyl, $C_5$-$C_{20}$ aryl, $C_6$-$C_{24}$ alkyaryl and aralkyl, wherein "alkyl" can be optionally interrupted by a group containing a heteroatom selected from N, O, and S, and "aryl" includes ring carbon atoms optionally replaced by a group containing a heteroatom selected from N, O, and S. Typically, the attached group resides at the pigment surface.

In one embodiment, a pigment prior to modification has an attached organic group or nucleophile that is native to the pigment structure. For example, the pigment is an organic pigment having substituents that can function as the attached nucleophile or hydroxyl-containing organic group. For example, certain organic pigments include phenol, naphthol, isoindolinone, isoindoline, and phthalimide groups in the chemical structure where these groups can function as nucleophiles or hydroxyl-containing organic groups. In another example, the pigment is selected from carbon black pigments (e.g., carbon black or oxidized carbon black, generally having a pH<7.0), providing attached ionic or ionizable groups such as alcohol, phenol, and/or carboxylic acid groups bound to the surface. The extent of oxidation of carbon black can determine the surface concentration of attached groups. Exemplary oxidizing agents for carbon blacks include oxygen gas, ozone, peroxides such as hydrogen peroxide, persulfates such as sodium and potassium persulfate, hypohalites such as sodium hypochlorite, nitric acid, and transition metal-containing oxidants such as permanganate salts, osmium tetroxide, chromium oxides, ceric ammonium nitrates, and mixtures thereof.

In another embodiment, the pigment prior to modification does not include substituents that are reactive under Mitsunobu conditions but can be chemically treated to attach nucleophilic or organic groups that are not native to the pigment chemical structure. For example carbon black can be subjected to a diazonium treatment to attach various organic groups that can function as protonated nucleophiles or hydroxyl-containing organic groups. In a more specific example, the carbon black can be pretreated with acidic groups (e.g., protonated nucleophiles having a $pK_a$<15 or a $pK_a$<11) such as carboxylic acids (which can be used as a Mitsunobu reactant) or sulfonic acids that can be further functionalized to provide the attached nucleophile or hydroxyl-containing organic group. Methods of attaching various groups by a diazonium treatment are disclosed in U.S. Pat. Nos. 6,852,158; 6,664,312; 6,551,393; 6,534,569; 6,372,820; 6,368,239; 6,350,519; 6,337,358; 6,103,380; 7,173,078; 7,056,962; 6,953,825; 6,942,724; 6,936,097; 6,929,889; 6,911,073; 6,494,943; 6,478,863; and 6,472,471, the disclosures of which are incorporated herein by reference.

In one embodiment, the protonated nucleophile has a $pK_a$<15, e.g., a $pK_a$<11, due to the presence of an acidic proton, where $pK_a$ is defined as:

$$pK_a(\text{water}) = -\log_{10}([H^+][\text{nucleophile}]/[H-\text{nucleophile}])$$

The $pK_a$ can be a useful measure of the reactivity of the protonated nucleophile under a Mitsunobu conditions.

Exemplary protonated nucleophiles include one or more of carboxylic acids; alcohols, such as phenols, naphthols, and fluorinated alcohols; thiols (e.g., thiophenols, naphthalene thiols); imides (e.g., phthalimides); N-heterocycles (aromatic or non-aromatic) containing an —NH ring substituent, such as azoles, e.g., imidazoles (e.g., purine bases) and pyrimidines (e.g., pyrimidine bases), isoindolinone, and isoindoline; azides (e.g., hydrazoic acid); thiocarboxylic acids; hydroxamic acids; phosphoric and phosphonic acids; β-diesters (e.g., malonic acid esters); and amines. In one embodiment, the protonated nucleophile is selected from carboxylic acids and alcohols, e.g., phenols and naphthols, imides (e.g., phthalimides), amides, and amines.

The hydroxyl-containing organic group can be a small molecule or a polymer. Exemplary small molecules include hydroxyl-containing or hydroxyl-terminated amines, diols, alkyl alcohols (e.g., $C_1$-$C_{12}$ alkyl alcohols), dicarboxylic acids, and bisphosphonates.

In one embodiment, the hydroxyl-containing organic group is selected from alcohols, which can be monoalcohols, diols, triols, or polyols. In one embodiment, the hydroxyl-containing organic group is a primary or secondary alcohol. Other functional groups can also be present in the hydroxyl-containing organic group, such as C—C multiple bonds, esters, ethers, acrylates.

In one embodiment, the hydroxyl-containing organic group comprises a hydroxyl-containing polymer, e.g., polyols, such as polymers commonly used in polyurethane chemistry (e.g., polyether polyols, polyester polyols, and polycarbonate polyols). Other hydroxyl-containing polymers include hydroxyl-containing polycaprolactone, hydroxyl-containing polystyrene, hydroxyl-containing poly(methyl methacrylate) or other acrylates, hydroxyl-containing polyisobutylene, hydroxyl-containing polybutadiene, hydroxyl-containing polyisoprene, polypropylene glycol, polyethylene glycol, and ethylene glycol-propylene glycol copolymer, poly(tetramethylene glycol), and hydroxyl-containing polydimethylsiloxane. The selection of polymer can be made based on the desired end properties of the pigment. In one embodiment, the hydroxyl-containing polymer is a hydroxyl-terminated polymer wherein any of the polymers listed herein can be hydroxyl-terminated.

In one embodiment, the polymer (minus the weight of the hydroxyl) has a molecular weight of at least 300, e.g., at least 500, at least 750, at least at least 1,000, or at least 2,000. In another embodiment, the polymer has a molecular weight ranging from 300 to 5,000, from 300 to 3,000, from 300 to 2,000, from 500 to 5,000, from 500 to 3,000, from 500 to 2,000 from 750 to 5,000, from 750 to 3,000, or from 750 to 2,000.

In one embodiment, a pigment has attached a nucleophile, which is subsequently reacted with a hydroxyl-containing organic group under Mitsunobu conditions, as depicted in the equation below:

The product thus formed is a modified pigment having attached an organic species comprising an attached nucleophile bonded to the organic group. In another embodiment, the pigment has attached a hydroxyl-containing organic group, which can be modified with a nucleophile under Mitsunobu conditions, as depicted in the equation below:

The product thus formed is a modified pigment having attached an organic species comprising an attached organic group bonded to the nucleophile.

In one embodiment, prior to the Mitsunobu reaction, the pigment is attached to one of the first or second reactant, where the other reactant not attached to the pigment comprises a polymer. In another embodiment, the pigment is attached to a protonated nucleophile and is reacted with a hydroxyl-containing organic compound, where the organic compound comprises a polymer, resulting in the formation of a polymer-modified pigment.

In one embodiment, "reacting under Mitsunobu conditions" refers to reacting in the presence of additional reagents, solvents, resulting intermediates, and/or other conditions that achieve a Mitsunobu reaction between protonated nucleophiles and hydroxyl-containing organic groups. In another embodiment, "reacting under Mitsunobu conditions" refers to reacting in the presence of reagents and/or resulting intermediates capable of deprotonating the acidic proton of the protonated nucleophile. In another embodiment, "reacting under Mitsunobu conditions" refers to reacting in the presence of reagents and/or resulting intermediates capable of removal of the hydroxyl from the hydroxyl-containing organic compound (e.g., by deprotonation and redox reactions). The net effect of the Mitsunobu reaction is a resulting bond formation between the nucleophile and the organic group with a net elimination of the proton from the protonated nucleophile and the hydroxyl from the hydroxyl-containing organic group.

In one embodiment, the Mitsunobu conditions include reagents selected from:

(a) trialkylphosphines or triarylphosphines, and
(b) azodicarboxylate esters or azodicarboxylate amides.

In one embodiment, "alkyl" of trialkylphosphines refers to substituted or unsubstituted $C_1$-$C_{12}$ alkyl and "aryl" of triarylphosphines refers to substituted or unsubstituted $C_5$-$C_{20}$ aryl. In another embodiment, the trialkylphosphines or triarylphosphines are selected from triphenyl phosphine, tributyl phosphine, trimethyl phosphine, diphenyl(2-pyridyl) phosphine, (4-dimethyl-aminophenyl)diphenylphosphine, tris-4-(4-dimethylaminophenyl)phosphine, 1,2-diphenylphosphinoethane, and compounds having the formula (A) or (B):

(A)

(B)

In one embodiment, the azodicarboxylate esters or azodicarboxylate amides are selected from diethyl azodicarboxylate (DEAD), diisopropyl azodicarboxylate (DIAD), di-t-butyl azodicarboxylate (DTBAD), 1,1'-(azodicarbonyl) dipiperidine (ADDP), 4,7-dimethyl-3,5,7-hexahydro-1,2,4,7-tetrazocin-3,8-dione (DHTD), N,N,N',N'-tetramethylazodicarboxamide (TMAD), N,N,N',N'-tetraisopropylazodicarboxamide (TIPA), di-4-chlorobenzyl azodicarboxylate (DCAD), and compounds having the formula (1), (2), or (3):

(1)

(2)

(3)

In one embodiment, "Mitsunobu conditions" include solvents commonly used for Mitsunobu reactions. Exemplary solvents include tetrahydrofuran (THF), toluene, benzene, dimethyl formamide (DMF), diethyl ether, acetonitrile, dichloromethane and 1,4-dioxane. However, other solvents such as N-methylpyrrolidone (NMP), ethyl acetate, butyl acetate, propylene glycol monomethyl ether acetate (PGMEA) and other glycol ether/acetate solvents.

In one embodiment, the pigment is organic. In one embodiment, the pigment contains an acidic —OH group, e.g., aryl/phenyl-containing —OH groups such as phenol and naphthol groups. Examples of naphthol-containing pigments are β-Naphthol Pigments, Naphthol AS Pigments or Naphthol Reds, and Red Azo Pigment Lakes. Other phenol/naphthol-containing pigments include Pigment Orange 2, Pigment Orange 5, Pigment Orange 17, Pigment Orange 17:1, Pigment Orange 22, Pigment Orange 24, Pigment Orange 38, Pigment Orange 46, Pigment Orange 187, Pigment Red 1, Pigment Red 2, Pigment Red 3, Pigment Red 4, Pigment Red 6, Pigment Red 7, Pigment Red 8, Pigment Red 9, Pigment Red 10, Pigment Red 11, Pigment Red 12, Pigment Red 13, Pigment Red 14, Pigment Red 15, Pigment Red 16, Pigment Red 17, Pigment Red 18, Pigment Red 21, Pigment Red 22, Pigment Red 23, Pigment Red 31, Pigment Red 32, Pigment Red 48:1, Pigment Red 48:2, Pigment Red 48:3, Pigment Red 48:4, Pigment Red 48:5, Pigment Red 49, Pigment Red 49:1, Pigment Red 49:2, Pigment Red 49:3, Pigment Red 50:1, Pigment Red 51, Pigment Red 52:1, Pigment Red 52:2, Pigment Red 53, Pigment Red 53:1, Pigment Red 53:3, Pigment Red 57:1, Pigment Red 58:2, Pigment Red 58:4, Pigment Red 63:1, Pigment Red 63:2, Pigment Red 64, Pigment Red 64:1, Pigment Red 68, Pigment Red 95, Pigment Red 112, Pigment Red 114, Pigment Red 119, Pigment Red 136, Pigment Red 146, Pigment Red 147, Pigment Red 148, Pigment Red 150, Pigment Red 151, Pigment Red 164, Pigment Red 170, Pigment Red 187, Pigment Red 188, Pigment Red 200, Pigment Red 210, Pigment Red 211, Pigment Red 212, Pigment Red 213, Pigment Red 222, Pigment Red 237, Pigment Red 238, Pigment Red 239, Pigment Red 240, Pigment Red 243, Pigment Red 245, Pigment Red 247, Pigment Red 253, Pigment Red 256, Pigment Red 261, Pigment Red 266, Pigment Red 267, Pigment Red 268, Pigment Red 269, Pigment Violet 13, Pigment Violet 25, Pigment Violet 33, Pigment Violet 50, Pigment Blue 25, Pigment Brown 1, and Pigment Brown 5. Pigments such as Pigment Red 171, Pigment Red 175, Pigment Red 176, Pigment Red 185, Pigment Red 208, Pigment Violet 32, Pigment Brown 25, although being classified as benzimidazolone pigments, also contain phenol groups. Similarly, some diazo condensation pigments such as Pigment Orange 31, Pigment Red 144, Pigment Red 166, Pigment Red 214, Pigment Red 220, Pigment Red 221, Pigment Red 242, Pigment Red 248, Pigment Red 262, Pigment Brown 23, Pigment Brown 41, and Pigment Brown 42 also contain phenol groups.

In one embodiment, the pigment is selected from organic pigments having an acidic —NH group, e.g., imides, amides, and amines that can function as the protonated nucleophile. In one embodiment, the pigments have isoindolinone and isoindoline groups and organic derivatives thereof. In another embodiment, the protonated nucleophile has any one of the following formula:

wherein $X_1$=O, NR', or $CR'_2$; $X_2$=NR', or $CR_2$, and R', $R^1$, and $R^2$ can be the same or different and are independently selected from hydrogen, alkyl, (e.g., $C_1$-$C_{12}$ alkyl), aryl (e.g., $C_5$-$C_{20}$ aryl), heteroalkyl (e.g., $C_1$-$C_{12}$ alkyls optionally interrupted by a group including one or more heteroatoms such as N, O, and S), and heteroaryl (e.g., $C_5$-$C_{20}$ aryls wherein at least one ring carbon atom is optionally replaced by heteroatoms such as N, O, and S), and wherein $R^1$ and $R^2$ can be joined to form a phthalimide ring system.

Tetrachlorisoindolinone and isoindoline pigments include Pigment Yellow 109, Pigment Yellow 110, Pigment Yellow 173, Pigment Orange 61, Pigment Yellow 139, Pigment Yellow 185, Pigment Orange 66, Pigment Orange 69, Pigment Red 260, and Pigment Brown 38. Among these pigments, Pigment Yellow 185, Pigment Yellow 139, Pigment Orange 69, and Pigment Red 260 contain additional imide NH groups, which can also participate in Mitsunobu reaction.

In one embodiment, the pigment is inorganic. Examples of inorganic pigments are black pigments, which include various carbon blacks (Pigment Black 7) such as channel blacks, furnace blacks and lamp blacks, and carbon black for example, carbon blacks sold under the Regal®, Black Pearls®, Elftex®, Monarch®, Mogul®, and Vulcan® trademarks available from Cabot Corporation.

The pigment prior to modification can have a wide range of BET surface areas, as measured by nitrogen adsorption, depending on the desired properties of the pigment. In one embodiment, the pigments have a BET surface area ranging from about 10 m²/g to about 1500 m²/g, such as a BET surface area ranging from about 20 m²/g to about 600 m²/g, or a BET surface area ranging from about 50 m²/g to about 300 m²/g. If the desired surface area is not readily available for the desired application, it is also well recognized by those skilled in the art that the pigment may be subjected to conventional size reduction or commination techniques, such as ball or jet milling or sonication, to reduce the pigment to a smaller particle size, if desired.

The pigment prior to modification can have a wide variety of primary particle sizes known in the art. In one embodiment, the pigment has a primary particle size ranging from about 5 nm to about 100 nm, such as a particle size ranging from about 10 nm to about 80 nm, or from about 15 nm to about 50 nm.

The pigment prior to modification can also have a wide range of dibutylphthalate absorption (DBP) values, which is a measure of the structure or branching of the pigment. In one embodiment, the pigment may be a carbon black having a DBP value ranging from about 25 to 400 mL/100 g, from about 30 to 200 mL/100 g, or from about 50 to 150 mL/100 g. In another embodiment, the pigment may be an organic pigment having an oil adsorption value (as described in ISO 787 T5) ranging from about 5 to 150 mL/100 g, from about 10 to 100 mL/100 g, or from about 20 to 80 mL/100 g.

In one embodiment, the modified pigment comprises a sufficient number of attached organic species (e.g., organic group or nucleophiles) to achieve a desirable property. In one embodiment, the number of attached organic species in the modified pigment is expressed as a weight percentage with respect to the total weight of the modified pigment. In one embodiment, the nucleophile or organic group is present in the modified pigment in an amount ranging from 1% to 80% by weight of the modified pigment, e.g., an amount ranging from 5% to 70% by weight, an amount ranging from 8% to 30% by weight of the modified pigment, or an amount ranging from 40-50% by weight of the modified pigment.

In one embodiment, the organic species comprises a polymer, in which the polymer is present in the modified pigment in an amount ranging from 1% to 80% by weight of the modified pigment, e.g., an amount ranging from 5% to 70% by weight, an amount ranging from 8% to 30%, or an amount ranging from 40% to 50% by weight of the modified pigment.

In another embodiment, the modified pigment comprises a total amount of organic species ranging from about 0.01 to about 10.0 µmol of groups/m² BET surface area of pigment, including from about 0.5 to about 5.0 µmol/m², from about 1 to about 3 µmol/m², or from about 2 to about 2.5 µmol/m².

In one embodiment, mixtures of nucleophiles and/or organic groups can be used to modify the pigment. For example, one or more types of nucleophiles can be attached to the pigment and reacted with one or more types of hydroxyl-containing organic groups to achieve a desired pigment property. Alternatively, one or more types of hydroxyl-containing organic groups can be attached to the pigment and reacted with one or more types of nucleophiles. Alternatively, two or more different pigment types can be used.

In one embodiment, the Mitsunobu reaction allows attachment of an organic group or a nucleophile to a pigment via a variety of linkages. Exemplary linkages include —C—O—, —O—C—, —N—C—, or —C—N— bonds that form esters, thioesters, ethers, thioethers, amides, imides, and amines, e.g., linkages selected from esters, ethers, and imides, such as phenol or naphthol esters or ethers, and phthalimides.

In one embodiment, the nucleophile is bonded to the organic group via linkages selected from esters, thioesters, ethers, thioethers, amides, imides, and amines. In another embodiment, the nucleophile is bonded to the organic group via linkages selected from phenyl esters, phenyl ethers, naphthol esters, naphthol ethers, and phthalimides.

In one embodiment, the Mitsunobu reaction comprises the step of "forming the modified pigment," which herein refers to forming the end product of the Mitsunobu reaction, e.g., the nucleophile bonded to the organic group. In another embodiment, the end product of the Mitsunobu reaction is not the final modified pigment but may be subjected to one or more additional reactions. Accordingly, in one embodiment, "forming the modified pigment" further comprises an additional reaction or step, such as hydrolyzing the organic species comprising the nucleophile bonded to the organic group.

In one embodiment, the Mitsunobu reaction can be performed as a single step or multi-step reaction. In another embodiment, the Mitsunobu reaction is performed as a one-pot reaction. In yet another embodiment, the Mitsunobu reaction can be performed under mild reaction conditions, e.g., room temperature.

In one embodiment, the method comprises reacting a pigment attached to protonated nucleophile with a hydroxyl-containing organic group, wherein the protonated nucleophile is selected from carboxylic acids, alcohols (e.g., phenols and naphthols), and imides (e.g., phthalimides). In one embodiment, the hydroxyl-containing organic group is selected from hydroxyl-containing or hydroxyl-terminated amines, diols, alkyl alcohols (e.g., $C_1$-$C_{12}$ alkyl alcohols), dicarboxylic acids, and bisphosphonates and hydroxyl-containing polymers, as disclosed herein. In one embodiment, the reacting is performed under Mitsunobu conditions, e.g., in the presence of reagents selected from (a) trialkylphosphines or triarylphosphines, and (b) azodicarboxylate esters or azodicarboxylate amides. In one embodiment, the method further comprises forming a modified pigment having attached the nucleophile that is bonded to the organic group, with net elimination of a proton and a hydroxyl.

One embodiment provides a modified pigment comprising a pigment (e.g., an organic pigment) attached to an organic group via an —N—C— bond, wherein the nitrogen atom of the —N—C— bond is native to the pigment. In this embodiment, the carbon atom of the —N—C-bond is not native to the pigment prior to modification, i.e., the chemical structure of the unmodified pigment does not include this carbon atom or any substituents bonded to it. The —N—C— bond can form a linkage selected from imides, amides, and amines. In another embodiment, the nitrogen atom native to the pigment belongs to a group selected from imides (e.g., phthalimides), N-heterocycles (aromatic or non-aromatic) containing an —NH ring substituent (e.g., imidazoles, pyrimidines, isoindoline, isoindolinone), amides, and amines.

Another embodiment provides a modified pigment comprising a pigment attached to an organic group via an —O—C— bond, wherein the —O—C— bond forms phenolate or naphtholate linkages, and wherein the phenolate or naphtholate linkages have aromatic groups that are native to the pigment. In this embodiment, the carbon atom of the —O—C— bond, and substituents thereof, are not native to the pigment, i.e., not a part of the pigment's chemical structure prior to modification. In one embodiment, the phenolate or naphtholate linkages are selected from phenyl esters, naphthyl esters, phenyl ethers, and naphthyl ethers. The pigment can be selected from carbon black pigments and organic pigments.

One embodiment provides a method of making a modified pigment, comprising:
reacting, under Mitsunobu conditions:
 (a) a pigment having attached a protonated nucleophile having a $pK_a$<15 (e.g., a $pK_a$<11), and
 (b) a hydroxyl-containing organic group, and
forming the modified pigment having attached an organic species comprising the nucleophile bonded to the organic group, with the net elimination of a proton and a hydroxyl.

Another embodiment provides a method of making a modified pigment, comprising:
reacting, under Mitsunobu conditions:
 (a) a protonated nucleophile having a $pK_a$<15 (e.g., a $pK_a$<11), and
 (b) a pigment having attached a hydroxyl-containing organic group, and
forming the modified pigment having attached an organic species comprising the nucleophile bonded to the organic group, with the net elimination of a proton and a hydroxyl.

In one embodiment, the protonated nucleophile is selected from carboxylic acids, phenols, naphthols, and phthalimides. In one embodiment, the nucleophile is bonded to the organic group via linkages selected from phenyl esters, phenyl ethers, naphthol esters, naphthol ethers, and phthalimides. In one embodiment, the hydroxyl-containing organic group is selected from hydroxyl-containing amines, diols, alkyl alcohols, hydroxyl-containing dicarboxylic acids, and hydroxyl-containing bisphosphonates. In another embodiment, the hydroxyl-containing organic group comprises a polymer, e.g., polymers selected from hydroxyl-containing polycaprolactone, polypropylene glycol, polyethylene glycol, ethylene glycol-propylene glycol copolymers, poly(tetramethylene glycol), hydroxyl-containing poly(methyl methacrylate), and hydroxyl-containing polydimethylsiloxane.

The modified pigment can be used in a variety of applications, including chemical toners, inkjet ink and electrophoretic ink compositions, black matrix materials, color filters, solvent coatings, UV curable inks/coatings, as described in further detail below.

Chemical Toners

One embodiment provides chemical toner compositions comprising a modified pigment, as disclosed herein, and a resin. "Chemical toners" or "chemically prepared toners" (CPTs), which, as defined herein, are toners having small and/or regular shapes. In one embodiment, the chemical toner has a smooth surface, e.g., substantially no sharp or jagged edges, such as those that arise by the comminuting of large particles into smaller particles. Contrary to conventional toner compositions, which are produced by combining a resin and a colorant followed by pulverization, chemical toners are typically prepared by forming toner particles in the presence of a colorant and a solvent, such as an aqueous solvent, and do not require a pulverization step. Current mechanical grinding processes used to prepare conventional toner compositions are not capable of efficiently producing small particle size toners as the energy consumed in grinding typically increases exponentially with the particle size. Also, irregularly shaped particles result from the conventional grinding processes, which cannot pack as well as regularly shaped particles, resulting in higher waste of toner per page.

In one embodiment, the chemical toner has a shape with no corners or edges, such as spheroidal or ellipsoidal shapes, including egg-shaped or potato-shaped. In one embodiment, the 3-dimensional rounded shapes have an aspect-ratio ranging from 1.0 to 3.0, such as an aspect-ratio ranging from 1.0 to 2.0, and even ranging from 1.2 to 1.3. In another embodiment, the chemical toner has a mean particle size ranging from 3 to 10 µm.

The resin of the chemical toner composition may be any resin known in the art. Suitable resins include, for example, polyamides, polyolefins, polycarbonates, styrene acrylates, styrene methacrylates, styrene butadienes, crosslinked styrene polymers, epoxies, polyurethanes, vinyl resins, including homopolymers or copolymers of two or more vinyl monomers, polyesters and mixtures thereof. The resin may include homopolymers of styrene and its derivatives and copolymers thereof such as polystyrene, poly-p-chlorostyrene, polyvinyltoluene, styrene-p-chlorostyrene copolymers, styrene-vinyltoluene copolymers, copolymers of styrene and acrylic acid esters such as methyl acrylate, ethyl acrylate,-n-butyl acrylate, and 2-ethylhexyl acrylate, copolymers of styrene and methacrylic acid esters such as methyl methacrylate, ethyl methacrylate, n-butyl methacrylate, and 2-ethylhexyl methacrylate, copolymers of styrene, acrylic acid esters and methacrylic acid esters, or copolymers of styrene with other vinyl monomers such as acrylonitrile (styrene-acrylonitrile-indene copolymers), vinyl methyl ether, butadiene, vinyl methyl ketone, and maleic acid esters. The resin may also be a polymethyl methacrylate resin, polybutyl methacrylate resin, a polyvinyl acetate resin, a polyvinyl butyral resin, a polyacrylic acid resin, a phenolic resin, an aliphatic or alicyclic hydrocarbon resin, a petroleum resin, or a chlorin paraffin. The resin may also be a polyester resin, such as copolyesters prepared from terephthalic acid (including substituted terephthalic acid), a bis[(hydroxyalkoxy)phenyl]alkane having from 1 to 4 carbon atoms in the alkoxy moiety and from 1 to 10 carbon atoms in the alkane moiety (which can also be halogen-substituted alkane), and alkylene glycol having from 1 to 4 carbon atoms in the alkylene moiety. Any of these resin types may be used either individually or as mixtures with these or other resins.

In one embodiment, the resin is present in the chemical toner composition in an amount ranging from about 60% and about 95% by weight of the chemical toner composition. Generally, resins suitable for use in xerographic toner manufacturing have a melting point ranging from about 100° C. and about 135° C. and have a glass transition temperature ($T_g$) greater than or equal to about 50° C.

The chemical toner composition can be prepared using any method known in the art. For example, the chemical toner compositions can be prepared by a coagulation process comprising forming a coagulated toner comprising the resin and the modified pigment and subsequently heating this mixture to a temperature above the $T_g$ of the polymer, thereby forming the chemical toner. In this process, typically the coagulated toner is prepared by combining an aqueous dispersion of the modified pigment and an aqueous emulsion of the resin, along with at least one coagulant. An optional wax may also be added. Suitable coagulants include, for example, salts (such as polyaluminum chloride, polyaluminum sulfosilicate, aluminum sulfate, magnesium sulfate, or zinc sulfate), or surfactants, including cationic surfactants such as, dialkyl benzenealkyl ammonium chloride, lauryl trimethyl ammonium chloride, alkylbenzyl methyl ammonium chloride, alkyl benzyl dimethyl ammonium bromide, benzalkonium chloride, cetyl pyridinium bromide, $C_{12}$, $C_{15}$, or $C_{17}$ trimethyl ammonium bromides, the halide salts of quaternized polyoxyethylalkylamines, or dodecylbenzyl triethyl ammonium chloride, or anionic surfactants such as sodium dodecylbenzene sulfonate and sodium dodecyl sulfate. Mixtures of these may also be used. The coagulant, which can be used in an amount of, for example, from about 0.01 to about 10 percent by weight of toner, causes the formation of aggregated particles of resin and polymer modified pigment. Coagulation may also be caused by a change in pH. Thus, the coagulant may be an acid or a base, depending on the pH of the aqueous polymer modified pigment dispersion and/or the aqueous resin emulsion. In addition, the coagulated toner may be formed using mechanical or physical means. The resulting coagulated toner of this process is then heated above the Tg of the polymer for a time and temperature sufficient to form a chemical toner composition. Further details of this process can be found in, for example, U.S. Pat. Nos. 6,562,541, 6,503,680, and 5,977,210, the disclosures of which are incorporated by reference herein.

The chemical toner composition can also be prepared by a process comprising forming a dispersion of the modified pigment (e.g., a polymer-modified pigment) in at least one monomer and suspending this dispersion in an aqueous medium, e.g., water. In this process, an initiator is also added, either in the polymer modified pigment dispersion or after forming the aqueous suspension. In one embodiment, the initiator is added in the modified pigment dispersion (e.g., a polymer-modified pigment dispersion). Other optional components, such as stabilizers, may also be added. The resulting suspension is then polymerized to form the chemical toner comprising a resin and the polymer modified pigment. The monomer may be any of those used to prepare the resins described above for the chemical toner compositions. Further details concerning specific aspects of this process can be found in, for example, U.S. Pat. Nos. 6,440,628, 6,264,357, 6,140,394, 5,741,618, 5,043,404, 4,845,007, and 4,601,968, all of which are incorporated in their entirety by reference herein.

The chemical toner composition can also be prepared using a process comprising forming a dispersion of the polymer modified pigment in a resin solution comprising at least one non-aqueous solvent and at least one polyester resin, forming an aqueous emulsion of this dispersion in an aqueous medium, such as water, and evaporating the solvent to form the chemical toner. Other optional components, such as dispersing aids and emulsion stabilizers, may also be added, either in the modified pigment dispersion or after forming the aqueous emulsion. The polyester resin may be any of those used for preparing chemical toner compositions described in more detail above. Further details concerning specific aspects of this process can be found in, for example, U.S. Pat. Nos. 6,787,280 and 5,968,702, all of which are incorporated in their entirety by reference herein.

For each of these processes for forming the chemical toner composition, the chemical toner may also be encapsulated. Encapsulation results in the formation of a polymer shell around the toner, producing a chemical toner having a core/shell structure. Any process for encapsulation known in the art can be used. The polymer used as the shell is chosen in order to provide performance and handling properties to the toner. For example, the resulting encapsulated toners may be more easily fused (e.g., at lower temperatures), and may also have higher and more uniform charging characteristics. Other properties may also result. Also, for each of these processes, the chemical toner may be further purified. For example, the chemical toner compositions produced by the processes described above may be washed to remove undesired by-products or impurities and subsequently dried.

The chemical toner composition may optionally contain additives that may also be mixed or blended into one or more of the components used to prepare these compositions. Exemplary additives include carrier additives, positive or negative charge control agents such as quaternary ammonium salts, pyridinium salts, sulfates, phosphates, and carboxylates, flow aid additives, silicone oils, or waxes such as commercially available polypropylenes and polyethylenes. The chemical toner composition can further comprise iron oxide, wherein the iron oxide can be magnetite, thus making the toner composition a magnetic toner composition. Generally, these additives are present in amounts of from about 0.05 by weight to about 30% by weight, however, lesser or greater amounts of the additives may be selected depending on the system and desired properties.

Inkjet Ink Compositions

One embodiment provides an inkjet ink composition comprising a liquid vehicle and at least one modified pigment, as disclosed herein. The amount of modified pigment used in the inkjet ink composition can be varied but is typically in an amount effective to provide the desired image quality (for example, optical density) without detrimentally affecting the performance of the inkjet ink. In one embodiment, the modified pigment is present in the inkjet ink composition in an amount ranging from about 0.1% to about 20% based on the weight of the inkjet ink composition.

The modified pigment can be provided in a variety of different forms. For example, the modified pigment may be a dry form, such as a powder, pellet, granule, or cake. In one embodiment, "dry" refers to a material being substantially free of water. As used herein, the term "dry" relating to the form of the modified pigment does not mean substantially free of volatile material. Thus, dry forms include forms containing a high level, such as about 50% or more, of a volatile solvent. The dry form may be a material having the consistency of, for example, a paste or putty in a solid or semi-solid form or may be, for example, a free flowing or tacky powder.

The vehicle can be either an aqueous or non-aqueous vehicle. In one embodiment, the vehicle contains water, e.g., the vehicle comprises an aqueous solution. In one embodiment, the aqueous solution contains greater than 50% by weight water and can be, for example, water or mixtures of water with water miscible solvents such as alcohols. The amount of modified pigment used in the dispersion form can be varied but is typically in an amount ranging from about 0.1% to about 20% based on the weight of the inkjet ink composition.

In one embodiment, the inkjet ink composition comprises the modified pigment in the form of a dispersion in a liquid vehicle. The dispersion can be prepared using any method known in the art. For example, the modified pigment in a dry form may be combined with the liquid vehicle with agitation to produce a stable dispersion. Any equipment known in the art, such as a media or ball mill, or other high shear mixing equipment can be used, and various conventional milling media may also be used. Other methods for forming the dispersion will be known to one skilled in the art.

The inkjet ink composition can be formed with a minimum of additional components (additives and/or cosolvents) and processing steps. However, suitable additives may also be incorporated into these inkjet ink compositions to impart a number of desired properties while maintaining the stability of the compositions. For example, surfactants may be added to further enhance the colloidal stability of the composition. Other additives are well known in the art and include humectants, biocides and fungicides, binders such as polymeric binders, pH control agents, drying accelerators, penetrants, and the like. The amount of a particular additive will vary depending on a variety of factors but are generally present in an amount ranging between 0% and 40% based on the weight of the inkjet ink composition. Additionally, the inkjet ink compositions of the present invention may further incorporate dyes to modify color balance and adjust optical density. Such dyes include food dyes, FD&C dyes, acid dyes, direct dyes, reactive dyes, derivatives of phthalocyanine sulfonic acids, including copper phthalocyanine derivatives, sodium salts, ammonium salts, potassium salts, and lithium salts.

In one embodiment, the inkjet ink composition comprises a cosolvent. In one embodiment, the cosolvent is soluble or miscible in water at concentrations of at least 10% by weight and is also chemically stable to aqueous hydrolysis conditions (e.g., reaction with water under heat aging conditions, including, for example, the hydrolysis of esters and lactones). In one embodiment, the cosolvent has a dielectric constant below that of water, such as a dielectric constant ranging from about 10 to about 78 at 20° C. Examples of suitable cosolvents include low molecular-weight glycols (such as ethylene glycol, diethylene glycol, triethylene glycol, tetraethylene glycol, dipropylene glycol, ethylene glycol monomethyl ether, ethylene glycol monoethyl ether, triethylene glycol monomethyl or monoethyl ether, diethylene glycol monomethyl ether, diethylene glycol monoethyl ether, diethylene glycol monobutyl ether, and tetraethylene glycol monobutyl ether); alcohols (such as ethanol, propanol, iso-propyl alcohol, n-butyl alcohol, sec-butyl alcohol, and tert-butyl alcohol, 2-propyn-1-ol (propargyl alcohol), 2-buten-1-ol, 3-buten-2-ol, 3-butyn-2-ol, and cyclopropanol); diols containing from about 2 to about 40 carbon atoms (such as 1,3-pentanediol, 1,4-butanediol, 1,5-pentanediol, 1,4-pentanediol, 1,6-hexanediol, 1,5-hexanediol, 2,6-hexanediol, neopentylglycol (2,2-dimethyl-1,3-propanediol), 1,3-propanediol, 1,4-butanediol, 1,5-pentanediol, 1,6-hexanediol, 1,2,6-hexanetriol, and poly(ethylene-co-propylene)glycol, as well as their reaction products with alkylene oxides, including ethylene oxides, including ethylene oxide and propylene oxide); triols containing from about 3 to about 40 carbon atoms (such as glycerine (glycerol), trimethylolethane, trimethylolpropane, 1,3,5-pentanetriol, 1,2,6-hexanetriol, and the like as well as their reaction products with alkylene oxides, including ethylene oxide, propylene oxide, and mixtures thereof); polyols (such as pentaerythritol); amides (such as dimethyl formaldehyde and dimethyl acetamide); ketones or ketoalcohols (such as acetone and diacetone alcohol); ethers (such as tetrahydrofuran and dioxane); lactams (such as 2-pyrrolidone, N-methyl-2-pyrrolidone, and ∈-caprolactam); ureas or urea derivatives (such as di-(2-hydroxyethyl)-5,5,-dimethyl hydantoin (dantacol) and 1,3-dimethyl-2-imidazolidinone); inner salts (such as betaine); and hydroxyamide derivatives (such as acetylethanolamine, acetylpropanolamine, propylcarboxyethanolamine, and propylcarboxy propanolamine, as well as their reaction products with alkylene oxides). Additional examples include saccharides (such as maltitol, sorbitol, gluconolactone and maltose); sulfoxide derivatives (symmetric and asymmetric) containing from about 2 to about 40 carbon atoms (such as dimethylsulfoxide, methylethylsulfoxide, and alkylphenyl sulfoxides); and sulfone derivatives (symmetric and asymmetric) containing from about 2 to about 40 carbon atoms (such as dimethylsulfone, methylethylsulfone, sulfolane (tetramethylenesulfone, a cyclic sulfone), dialkyl sulfones, alkyl phenyl sulfones, dimethylsulfone, methylethylsulfone, diethylsulfone, ethylpropylsulfone, methylphenylsulfone, methylsulfolane, and dimethylsulfolane). These cosolvents may be used alone or in combination.

The amount of the cosolvent can be varied depending on a variety of factors, including the properties of the cosolvent (solubility and/or dielectric constant), the type of modified pigment, and the desired performance of the resulting inkjet ink composition. In particular, the optional cosolvent may be used in amounts of less than or equal to about 40% by weight based on the total weight of the inkjet ink composition, including less than or equal to about 30% and less than or equal to about 20%. Also, when used, the amount of the optional cosolvent is greater than or equal to about 2% by weight based on the total weight of the inkjet ink composition, including greater than or equal to about 5% and greater than or equal to about 10% by weight.

Black Matrix Materials

One embodiment provides a black matrix comprising the modified pigment, as disclosed herein, a liquid vehicle, and a curable resin (including those curable resins described under "Polymerizable/Curable Compositions"). A black matrix is an integral component of an image display, e.g., a liquid crystal display (LCD). Examples of liquid crystal displays include, for example, super twisted nematic (STN) displays and thin film transistor (TFT) displays. Each of these types of liquid crystal displays contains a black matrix element. A black matrix is generally formed by applying a photosensitive coating on a clear substrate, exposing the coating imagewise, developing and drying the coating. In one embodiment, the photosensitive coating comprises at least one modified pigment product and a solvent. This may further contain a resin such as a photosensitive resin. The black matrix further comprises colored layers. The color layers may be, for example, red, green and blue, or cyan, magenta and yellow. The details of the various conventional components and techniques for such black matrices are described in Japanese patents JP11062119; JP10300921; JP11006914; JP 11014822 JP 11142639, the disclosures of which are incorporated in their entirety by reference herein.

In one embodiment, the modified pigment comprises a modified carbon black. The curable resin may be formed using any method known to those skilled in the art, including, for example, using high shear mixing. Black matrix materials may be prepared using a dispersion of the modified pigment particles in a vehicle, such as a millbase. Such a millbase may have at least 20 weight percent, for example, at least 30 weight percent, of modified pigment particles (e.g., carbon black). When the millbase includes 50 wt. % modified pigment particles (e.g., carbon black), it may be a Newtonian fluid. In one embodiment, the amount of resin in the cured coating substantially fills the void volume defined by the shape of the pigment particle aggregates.

The vehicle may be either an aqueous vehicle or a non-aqueous vehicle. Examples include non-aqueous vehicles including one or more of butanol (e.g., one or more of n-butanol, sec-butanol, tert-butanol, and isobutanol), 2-heptanone, butyl acetate, ethylcellosolve, ethylcellosolve acetate, butylcellosolve, butylcellosolve acetate, ethylcarbitol, ethylcarbitol acetate, diethyleneglycol, cyclohexanone, propyleneglycol monomethylether, propyleneglycol monomethylether acetate, lactate esters, dimethyl formamide, methyl ethyl ketone, dimethylacetamide, and mixtures thereof. Aqueous solvents may also be added, including, for example, water and water soluble alcohols.

The curable resin may be any resin known in the art (including those curable resins described under "Polymerizable/Curable Compositions"). For example, the resin may be an epoxy bisphenol-A resin or an epoxy novolac resin. The resin may also be an acrylic resin, a polyimide resin, a urethane resin, a polyester resin, or a gelatin. The resin may be cured by any of a variety of known methods, including, for example, thermally or by any source of radiation such as, for example, infrared or ultraviolet radiation. The curable coating composition may be photosensitive (i.e. may be cured by irradiation) or thermosensitive (i.e., may be cured by changing temperature, such as by heating). When the resin is curable by irradiation, the curable coating composition may further include a photoinitiator, which generates a radical on absorbing light with the respective pigment.

The curable resin or millbase may be formed with a minimum of additional components (additives and/or cosolvents) and processing steps. However, additives such as dispersants and cosolvents may also be included. For example, when a photosensitive resin is used, such as epoxy bisphenol-A or epoxy novolak, a photoinitiator can also be added. Other curable monomers and/or oligomers may also be added.

In another embodiment, the black matrix composition may be a cured coating prepared from a curable coating composition. The cured coating may include a resin (e.g., a curable resin), an optional dispersant, and the modified pigment (e.g., carbon black) such as any of those described herein. When the coating includes at least 60 wt. % of modified pigment (e.g., carbon black), the surface resistivity may be at least $10^{12}$ ohm/square, e.g., at least $10^{13}$ ohm/square. A black matrix may have an optical density of greater than or equal to 3, e.g., greater than or equal to 4, and even greater than or equal to 5. In one embodiment, the optical density ranges from 3.5 and 10, at a 1 μm thickness. The coatings may have similar electrical properties (such as resistivity) at greater film thicknesses, including, for example, 10-100 μm thickness, depending on the application of the coating.

The black matrix material may be used in, for example, a color filter in a liquid crystal display device. The black matrix can be formed using any method known in the art. For example, the black matrix may be formed by applying a curable coating composition comprising a modified pigment (e.g., carbon black) onto a substrate, curing the resulting curable coating imagewise to produce a cured coating, and developing and drying the cured coating. For example, the black matrix may be prepared from the curable coating composition, curable coating, and/or the cured coating, as described in more detail below.

Coatings

The modified pigments may also be used in aqueous or non-aqueous coating compositions such as paints or finishes. Thus, one embodiment provides a coating composition comprising the modified pigments disclosed herein and a vehicle/carrier (e.g., a solvent), and optionally, other additives as disclosed herein. The coating composition can be prepared in any suitable manner, for example, by combining the modified pigment particles with the vehicle/carrier or carrier precursor, as well as with other components of the coating composition (e.g., pigment(s), dispersant(s), vehicle(s), other colorant(s), coalescing agent(s), flow additive(s), defoamer(s), surfactant(s), rust inhibitor(s), charge control agent(s), and the like), by any suitable methods, many of which are well known in the art. For example, the modified pigment particles can be added to a mixture of the carrier or carrier precursor and a suitable vehicle and then dispersed therein using any suitable means. Alternatively, the modified pigment particles can be added to a vehicle and then dispersed therein, with the carrier or carrier precursor added thereafter. In other embodiments, the modified pigment particles can be added to the carrier or carrier precursor and dispersed directly therein without use of a vehicle. Additional components such as described herein can be added at any suitable stage in the preparation of the coating composition.

In one embodiment, the aqueous coating compositions contain the modified pigment in an amount of less than or equal to 20% by weight of the coating. Aqueous coating compositions can comprise water as the sole solvent or water in combination with organic solvents, examples of which are disclosed herein.

Non-aqueous coating formulations vary widely depending on the conditions and requirements of final use. In general, coating systems contain up to 30% by weight of the modified pigment, e.g., modified carbon black. The resin content can vary widely up to nearly 100%. Examples include acrylic, alkyd, urethane, epoxy, cellulosics, and the like. Solvent content may vary between 0 and 80%. Examples include aromatic hydrocarbons, aliphatic hydrocarbons, alcohols, polyalcohols, ketones, esters, and the like. Two general classes of additives are fillers and modifiers. Examples of fillers are other coloring pigments, clays, talcs, silicas, and carbonates. Fillers can be added up to 60% depending on final use requirements. Examples of modifiers are flow and leveling aids and biocides generally added at less than 5%. The modified pigments disclosed herein can be incorporated into a non-aqueous coating composition using standard techniques either as a predispersion or as a solid.

Suitable examples of organic solvents include alcohols (e.g., methanol and isobutanol), glycols, ethers (e.g., tetrahydrofuran or diethylether), ketones (e.g., acetone, methylethyl ketone, or methylbutyl ketone), esters (e.g., n-butyl propionate), acetates (e.g., ethyl acetate), amides (e.g., dimethylformamide), sulfoxides (e.g., dimethylsulfoxide), hydrocarbons, aromatics (e.g., toluene), halocarbons (e.g., chloroform), and miscible mixtures thereof (e.g., ethylene glycol and methanol). Conventional co-solvents including but not limited to butyl acetate, ethylcellosolve, ethylcellosolve acetate, butylcellosolve, butylcellosolve acetate, ethylcarbitol, ethylcarbitol acetate, diethylene glycol, cyclohexanone, propylene glycol monomethyl ether, propylene glycol monomethyl ether acetate, lactate esters, and mixtures of these may also be employed.

In some embodiments, the vehicle is not organic solvent alone, but is a mixture or solution of organic solvent(s) and water. For example, the solvent may be a non-aqueous solvent and may further include from about 10% to about 20% water, from about 20% to about 30% water, from about 30% to about 40% water, from about 50% to about 60% water, from about 60% to about 70% water, from about 70% to about 80% water, from about 80% to about 90% water, or even from about 90% to about 100% water. Any suitable concentration of vehicle can be present in the coating composition. The coating composition can comprise about 10 wt. % or more vehicle, about 20 wt. % or more vehicle, about 30 wt. % or more vehicle, or about 40 wt. % or more vehicle. Alternatively, or in addition, the coating composition can comprise about 99 wt. % or less vehicle, about 80 wt. % or less vehicle, about 70 wt. % or less vehicle, about 60 wt. % or less vehicle, or about 50 wt. % or less vehicle. In another embodiment, the coating composition can comprise the vehicle in an amount ranging from to about 10 wt. % to about 99 wt. %, from about 20 wt. % to about 80 wt. %, from about 30 wt. % to about 80 wt. %, or from about 40 wt. % to about 70 wt. % vehicle.

In one embodiment, the coating composition comprises a carrier that promotes a hydrophobic surface. The carrier can be any compound that chemically or physically locks the modified pigment particles to each other and/or to a substrate. In one embodiment, the substrate is selected from glasses, plastics, metals, ceramics, papers, and woods, and painted, coated, or waxed surfaces thereof. Carriers can comprise, for example, any suitable resin or polymer. Examples of suitable resins include, but are not limited to, polyalkenes (such as polyethylene and polypropylene), phenolic resins, polyanhydrides, polyesters, epoxies, polyurethanes, cellulosics, alkyds, acrylics, polyolefins, polyolefin elastomers (such as ethylene propylene rubbers (EPR or EPDM), ethylene vinyl acetate (EVA), styrene-block copolymers (SBCs), and poly vinyl chloride (PVC)), polyamides, vinyl polymers, synthetic rubbers (such as polyisoprene, polybutadiene, polychloroprene, and polyisobutylene), natural rubbers, natural rubber latexes and copolymers, and random copolymers, block copolymers, alternating copolymers, graft copolymers, comb/brush copolymers, dendrimers, mixtures of oligomers and precursors thereof. A non-limiting example of a polyester polymer includes polycaprolactone. Non-limiting examples of vinyl polymers include polystyrene, polyvinyl chloride, polyvinyl acetate, polyvinyl butyrate, and polyacrylonitrile. Non-limiting examples of fluorinated polymers include (polytetrafluoroethylene), (perfluoroalkoxy polymer resin), (fluorinated ethylene-propylene), polyethylenetetrafluoroethylene, polyvinylfluoride, polyethylenechlorotrifluoroethylene, polyvinylidene fluoride, and polychlorotrifluoroethylene. Non-limiting examples of conductive polymers include poly(acetylene)s, poly(pyrrole)s, polyanilines, polythiophenes, poly(p-phenylene sulfide), poly(p-phenylene vinylene)s (PPV), polyindole, polypyrene, polycarbazole, polyazulene, polyazepine, poly(fluorene)s, and polynaphthalene. Non-limiting examples of inorganic polymers include polysiloxanes such as polydimethylsiloxane (PDMS) and other silicone rubbers, polyphosphazenes, polysulfoxides, borazines, and polystannanes.

The carrier may further include at least one dispersant. Examples of suitable dispersants include, but are not limited to, polyalkylene oxides (such as polyethylene oxide or polypropylene oxide), polyesters (such as polycaprolactone, polyvalerolactone, poly(hydroxy stearic acid), or poly(hydroxyoleic acid), polyamides such as polycaprolactam, polyacrylates, and block copolymers having both a hydrophobic and a hydrophilic group. Additional examples include amine-functionalized derivatives (such as polyamine, tertiary amine, or quaternary ammonium functionalized derivatives like tetraoctylammonium bromide) or acid functionalized derivatives (such as carboxylic acid or phosphonic acid functionalized derivatives) of these, such as amine-functionalized or amine-terminated polyalkylene oxides or acrylic polymers comprising amine or acid functional groups. Other suitable dispersants will be known to one skilled in the art or could be identified by adding the dispersant to the solvent above its critical micelle concentration (CMC) and determining if associative structures, such as inverse micelles, have formed. In one embodiment, the dispersants not only form associative structures in the solvent but also form such structures in the dispersion itself—e.g., in the presence of the particles. Techniques such as light scattering methods known in the art can be used to detect the presence of such structures in either the solvent or in the dispersion.

Specific dispersants can be chosen based on the type of particle used and the desired overall properties of the dispersion used in the coating formulation. For example, if the particle is a modified particle, the dispersant may include at least one functional group selected to complement the type of organic group attached to the particle.

Exemplary dispersants that may be employed include but are not limited to the OLOA series (modified polyisobutylene succinimides) from Chevron Chemical Co. Also included but not limited are: Disberbyk 108, Disberbyk 115, Disberbyk 116, Disberbyk 161, Disberbyk 163, Disberbyk 182 Disberbyk 2150 and Disberbyk 2050, all available from BYK Chemie, Solsperse™ dispersants available from Lubrizol, including Solsperse™ 27000, Solsperse™ 32000, Solsperse™ 32500, Solsperse™ 35140, Solsperse™ 38500, and Solsperse™ 39000, and K-Sperse™ dispersants such as K-Sperse 504XD from King Industries.

The amount of dispersant can be varied depending on the type of pigment, the solvent, and the pigment loading level. In general, the ratio of the amount of dispersant to the amount of pigment can be between about 0.1 or more (e.g., from about 0.2 or more, or from about 0.3 or more, or from about 0.5 or more, or even about from about 1 or more). Alternatively, or in addition, the ratio of the amount of dispersant to the amount of pigment can be about 10 or less (e.g., about 5 or less, or about 4 or less, or about 3 or less, or about 2.5 or less). Thus, the ratio of the amount of dispersant to the amount of pigment can comprise a ratio bounded by any two of the aforementioned endpoints. For example the ratio of the amount of dispersant to the amount of pigment can be about 0.01 to about 10, about 0.1 to about 5, about 0.1 to about 2.5, 0.5 to about 2.5, or about 1 to 2.5. While the use of a dispersant is optional, it has been found that dispersants can impart improved properties, such as stability and low viscosity, to high loading dispersions. This is also true even when the level of dispersant is high.

The dispersions can be prepared using any method known in the art. For example, the pigment and solvent may be combined with agitation to produce a stable dispersion, and, if used, a dispersant may be added. Also, if the pigment is dispersible in water, the aqueous solvent of this dispersion may be exchanged for another solvent, e.g., an organic solvent. Exemplary solvent exchange methods include diafiltration/ultrafiltration and addition of the solvent during evaporation of the aqueous solvent. Alternatively, if a dispersant is used, this can be combined with the pigment, and the resulting combination can then be combined with the solvent. The pigment, dispersant, and solvent may be combined in any equipment known in the art, such as a media or ball mill, or other high shear mixing equipment, such as a rotor-stator mixer. Various conventional milling media can also be used. Other methods for forming the dispersion will be known to one skilled in the art.

The coating composition can be formed with a minimum of additional components (additives and/or cosolvents) and processing steps. For example, when a photosensitive resin is used, such as epoxy bisphenol-A or epoxy novolak, a photoinitiator can also be added.

The coating composition can further include any of a variety of components that are known in the art to be suitable for incorporation into a surface coating composition. Such components include colorants, pigments, UV stabilizers, coalescing agents, flow additives, defoamers, surfactants, rust inhibitors, biocides and antimicrobial agents, charge control agents, and the like.

A coalescing agent promotes the softening of the resin during drying of the components of the coating composition, and such materials are well known. One example of a coalescing agent is butyl CELLOSOLVE (ARCO Chemical Company, Newtown Square, Pa.). Any suitable concentration of coalescing agent can be present in the coating composition, such as about 1-35% w/w.

A flow additive promotes the wetting of the substrate by the coating composition and the levelling of the coating composition on the substrate. A typical flow additive is DISBERBYK 301 (BYK-Chemie, Germany). Any suitable concentration of flow additive can be present in the coating composition, such as about 0.5-4% w/w.

A defoamer can be utilized to reduce the presence of bubbles in the coating composition upon mixing of the components. Any suitable defoamer can be used in the coating composition. An example of a suitable defoamer is DISBERBYK 035 (BYK-Chemie, Germany). Any suitable concentration of defoamer can be present in the coating composition, such as about 0.01-3% w/w.

A surfactant can be utilized to reduce the surface tension of the coating composition. Any suitable surfactant can be used in the coating composition. An example of a suitable surfactant is SURFYNOL 104 BC (Air Products & Chemicals, Inc.). Any suitable concentration of surfactant can be present in the coating composition, such as about 0.01-3% w/w.

If the coating composition is applied to surfaces vulnerable to corrosion, a rust inhibitor can be utilized in the coating composition. A variety of rust inhibitors are suitable for use in the coating composition. An example of a suitable rust inhibitor is ammonium benzoate. Any suitable concentration of rust inhibitor can be present in the coating composition, such as about 0.01-2% w/w.

A charge control agent can be utilized to control the charge or stability of the pigments within the coating composition. Any suitable charge control agent can be used in the coating composition. Examples of suitable charge control agents include polyisobutylene succinimide, tetraoctyl ammonium bromide, and the like. Any suitable concentration of the charge control agent can be present in the coating composition, such as about 1-4% w/w.

Disclosed herein are methods for preparing a coated article, wherein the method comprises (i) combining (a) a modified pigment, as disclosed herein, and (b) a carrier or a carrier precursor, to produce a coating composition, and (ii) applying the coating composition to at least a portion of an article to produce the coated article.

The coating composition can be applied to at least a portion of the article using any suitable method. For example, the coating composition can be applied by painting, dip coating, spraying, microgravure printing, spin coating, gravure coating, web coating, casting slit coating, slot coating, or and other techniques that spread a thin layer of fluid on a surface such as by drawing down of the coating composition on the surface of the article. Other methods of depositing a coating composition include, but are not limited to high shear mixing of the modified pigments, resin, and solvent vehicle into a dispersion, followed by deposition and allowing the solvent to evaporate, leaving behind a coating at the surface.

The thickness of the coating is not limited and depends on the intended application for the coating. For example, the thickness of the coating can range from about 1 μm to any suitable thickness, such as several millimeters, for example, from about 1 mm to about 20 mm or even greater. In this regard, the coating can be prepared by a single application of a coating composition to a substrate, or by several successive applications of a coating composition to a substrate, followed by partial or complete evaporation of a vehicle and/or any volatile components of the coating composition. Suitable methods for application of coating compositions will be readily apparent to one of ordinary skill in the art.

Polymerizable/Curable Compositions

The modified pigments may be used in compositions comprising polymerizable or curable materials. In some embodiments, the composition (e.g., coating composition, polymerizable and/or curable composition) comprises at least one carrier precursor, e.g., a polymerizable monomer, curable resin, prepolymer, oligomer, or any other precursor which is further polymerized or reacted in the course of transforming the coating composition to a coating. In some embodiments, the coating composition comprises at least one polymerizable monomer, and the at least one polymerizable monomer is polymerized to form the carrier. The carrier precursor may include any curable resin known in the art. Exemplary cured resins include but are not limited to phenolic resins, e.g., epoxy bisphenol-A resin or epoxy novolac resin, acrylic resins, methacrylic resins, polystyrene resins, styrene-acrylic resins, poly vinyl butyral, urethane resins, or polyolefin resins. The curable resin is one that may be cured thermally or by any source of radiation such as, for example, ultraviolet radiation. Likewise, polymers, oligomers, and monomers in the coating composition may be thermally or radiation polymerizable (e.g., UV-curable) or cross-linkable. For example, monomers or oligomers of any of the resins disclosed herein or of polymers such as acrylates, methacrylates, epoxides, terminal alkenes, diisocyanates, diols, diamines and styrenics, may be included in the curable coating composition in addition to or as alternatives to the cured resins listed above. Prepolymers for polyurethanes and polyureas, such as hydroxyl-, amine-, or isocyanate-terminated oligomers, may also be employed. In this way, the coating composition may be photosensitive (i.e. may be cured by irradiation) or thermosensitive (i.e., may be cured by changing temperature, such as by heating). When the components of the coating composition are curable by irradiation, the coating composition may further comprise a photoinitiator, which generates a radical on absorbing light with the respective particle. In certain embodiments, the coating composition comprises a UV-curable resin, in that the composition is cured by irradiation in the ultraviolet region of the spectrum (100-400 nm), for example, by exposure to UV light (e.g., from a hydrogen or deuterium source) for about 10-20 s at about 100° C.

The curable resin, prepolymer, polymer, monomer, or oligomer may be chosen to be compatible (i.e., form a one-phase combination) with the other materials of the coating composition. A solubility parameter can be used to indicate compatibility, as discussed in *Polymer Handbook*, J. Brandrup, ed., pp. VII 519-557 (1989), incorporated herein by reference. The solubility parameter may also be employed to optimize the choice of modification for the pigment, the solvents and dispersants employed in the mixture, or any other material used to form the coating. In the end, it is desired that the resin selected be insoluble in water, and the coating formulation be insoluble in water.

Electrophoretic Inks

One embodiment provides an electrophoretic ink comprising the modified pigment, as disclosed herein, for electrophoretic image displays. In general, an electrophoretic display contains particles arranged between two electrodes, one being transparent. The particles carry a charge and can respond to changes in the polarity of the electrodes. Depending on the relative polarity and/or charge of the pigment, the particles will move towards or away from either electrode. In this way, an image is formed, which can be viewed through the transparent electrode.

In one embodiment, the electrophoretic displays disclosed herein comprise microcapsules containing a dielectric fluid and particles suspended therein, in which the particles comprise at least one modified pigment having attached at least one organic group, as disclosed herein. In one embodiment, the fluid has a different color than the modified pigment product to provide a visual contrast.

In one embodiment, the microcapsules can contain particles wherein a portion of the particles have attached one type of organic group and another portion of the particles have attached a different organic group. In a further or another embodiment, the particles have organic groups having ionic and/or ionizable groups such that their response to a potential difference is different, e.g., ionic and/or ionizable groups having a greater affinity for a positive or negative-charge compared to other particles having a different organic group with an ionic and/or ionizable group. This embodiment may permit the ability to achieve multi-color displays with numerous options. Conventional particles (e.g., charged or uncharged) can be used in combination with the modified particles to accomplish the desired multi-colored display.

In another embodiment, the particles themselves comprise different pigments of varying colors. If combined with different ionic and/or ionizable groups having a respective unique responses to a potential difference between the electrodes, the resulting system comprises particles of, which can be substantially non-overlapping, to create various multi-colored displays. In one embodiment, when the response to the potential difference differs amongst the various colored particles based on the type of organic group attached to each of these particles, controlling the electric field permits the desired display described in U.S. Pat. No. 6,017,584 incorporated in its entirety by reference herein.

In one embodiment, the particles can be any size from about 100 microns or more to less than one micron, e.g. a size ranging from about 0.05 microns to about 25 microns.

EXAMPLES

General procedure: All glassware was dried at 120° C. for a minimum of 1 hour prior to use. Pigments were dried at 120° C. for a minimum of 2 hours and stored in a desiccator over Dri-rite. All reactions were performed under nitrogen. Particle sizes were obtained by dynamic light scattering using a Microtrac Nanotrac 252 outfitted with an external probe. Pigment yellow 185 was obtained from BASF.

A simple proxy test to distinguish between adsorption of polymer and chemical attachment to pigment surface was developed for polycaprolactone-based polymer. A sample of the treated pigment to be tested is prepared in the form of a concentrated dispersion and is added to water-saturated ethyl acetate. Pigments with adsorbed polymer (such as pigment or carbon black dispersed in ethyl acetate using an amine-anchored polycaprolactone dispersant such as Disperbyk 163) had been shown to be unstable in water-saturated ethyl acetate over a period of 1-24 hours, whereas pigments with chemically attached polymers remained stable for at least 1, 2, or 3 or more months.

Example 1

This Example describes the surface modification of an organic pigment, yellow 185, with monohydroxy-terminated polycaprolactone (BASF) using the Mitsunobu reaction.

Figure 1:
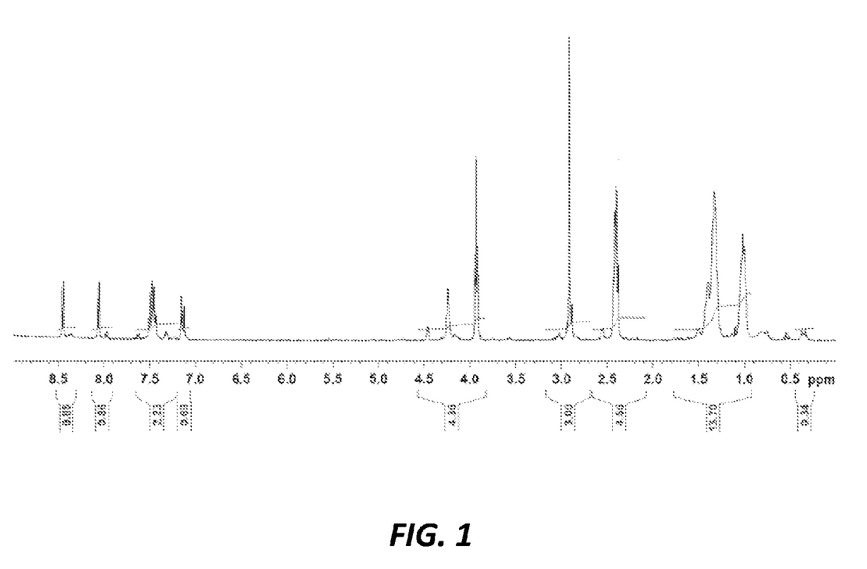
FIG. 1 is an overlay plot of GPC chromatograms (450 nm UV and RI detector) of a reaction product from the Mitsunobu reaction between PY185 and polycaprolactone of Example 1.

Two 3-neck round bottom flasks equipped with addition funnels were set up side by side. In flask 1, 10 g of PY185 and 45 g of a 43% (w/w) solution of monohydroxy-terminated polycaprolactone (number average molecular weight of 2000) in THF were stirred for 10 min at 300 rpm. In flask 2, 27 g of a 20% (w/w) solution of triphenylphosphine in THF was combined with 45 g of a 43% (w/w) solution of monohydroxy-terminated polycaprolactone in THF. 22 g of a 20% (w/w) solution of diisopropyl azodicarboxylate (DIAD) was added dropwise to the solution in flask 2 over 20 min. The resultant solution in flask 2 was added dropwise over 10 minutes to the contents of flask 1, generating a bright orange slurry. The mixture was stirred at 300 rpm for 2 days. Three drops concentrated HCl was added, generating a bright yellow slurry that was purified by trituration with hexanes and centrifugation at 4400 rpm. The supernatant was decanted and discarded. The precipitated solids were dried overnight in a forced-air oven at 90° C. The modified pigment material was found to contain 40-50 wt % of polymer by integration of $^1$H NMR as shown in FIG. 1 (7.15 ppm, 7.50 ppm, 8.05 ppm (PY 185 aromatic); 3.92 ppm, 4.23 ppm, 4.45 ppm (polycaprolactone —COO—$CH_2$; ~2.90 ppm (polycaprolactone —$CH_2$COO—); 2.40 ppm ($CH_3$ near amide in PY185); ~1.0 ppm (br) and ~1.35 ppm (br) ($CH_2$ not adjacent to ester group in polycaprolactone repeat unit). The solid was redispersed in ethyl acetate using a sonicating bath: volume average particle size, $M_v$=143 nm, number average particle size, $M_n$=76 nm, 95% of particles 231 nm or smaller; untreated PY185 has particle sizes averaging about 1 μm.

The dispersion of modified PY185 in ethyl acetate was sonicated in a bath sonicator and centrifuged at 20,000 rpm for 30 minutes. The supernatant was collected and dried in a forced-air oven. The dried supernatant was used for GPC analysis with both UV and RI detectors. The GPC results are summarized in Table 1 below:

TABLE 1*

| Sample | Peak | Mp | Mn | Mw | PDI |
|---|---|---|---|---|---|
| RI Detector | | | | | |
| Monohydroxy-terminated PCL | 1 | 4,890 | 3,963 | 5,909 | 1.49 |
| PCL modified PY185 | 1 | 11,884 | 7,342 | 10,603 | 1.44 |
| 450 nm Detector | | | | | |
| PCL modified PY185 | 1 | 11,682 | 6,915 | 10,002 | 1.45 |
| PY185 in THF | 1 | 282 | 323 | 351 | 1.09 |

*Mp: peak molecular weight; Mn: number average molecular weight; Mw: weight average molecular weight; PDI: polydispersity (calculated by the ratio of Mw/Mn)

Figure 2:
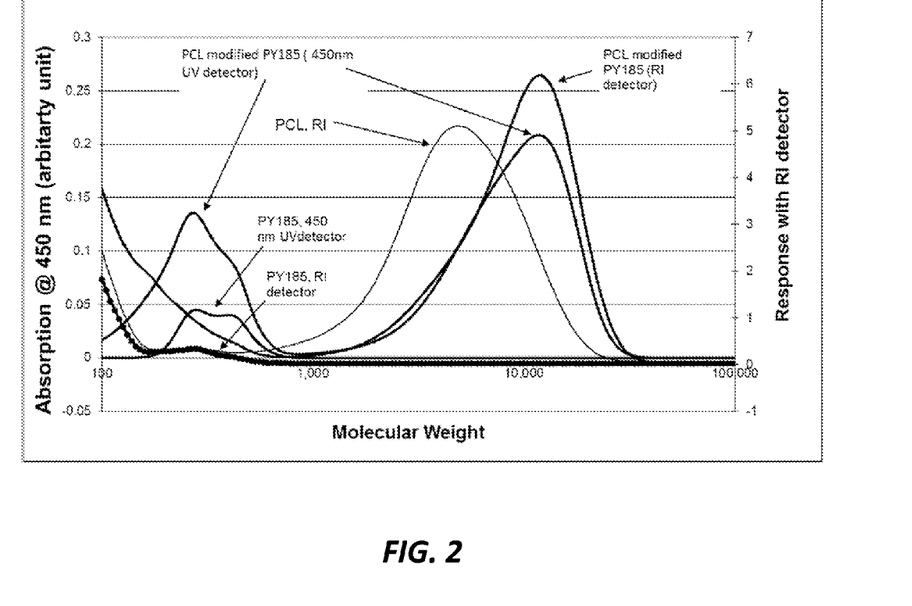
FIG. 2 is a $^1$H NMR spectrum of a reaction product from the Mitsunobu reaction between PY185 and polycaprolactone of Example 1.

In Table 1, MW's are reported relative to polystyrene. "PCL" refers to polycaprolactone. "PCL modified PY185" refers to the pigment modified with monohydrox-terminated polycaprolactone obtained in Example 1. FIG. 2 shows an overlay of the GPC traces with both an RI and UV detector.

A small sample of the solid was redispersed in water-saturated ethyl acetate. This dispersion remained stable for two months.

Example 2

This Example describes the surface modification of oxidized carbon black (Regal 400R, Cabot Corporation) with monohydroxy-terminated polycaprolactone (BASF) using the Mitsunobu reaction.

Two 3-neck round bottom flasks equipped with addition funnels were set up side by side. In flask 1, 10 g of carbon black (Regal 400R) and 45 g of a 43% (w/w) solution of monohydroxy-terminated polycaprolactone (number average molecular weight of 2000) in THF were stirred for 10 min at 300 rpm. In flask 2, 27 g of a 20% (w/w) solution of triphenylphosphine in THF was combined with 45 g of a 43% (w/w) solution of monohydroxy-terminated polycaprolactone in THF. 22 g of a 20% (w/w) solution of DIAD was added dropwise to the solution in flask 2 over 25 min. The resultant solution in flask 2 was added dropwise over 15 minutes to the contents of flask 1. The mixture was stirred at 300 rpm for 2 days. THF was removed by evaporation. Approximately 100 mL ethyl acetate and 140 mL toluene were added to the resultant paste. This dispersion was then purified by trituration with hexanes and centrifugation at 4400 rpm. The supernatant was decanted and discarded. The precipitated solids were dried overnight in a forced-air oven at 90° C. A sample of the solid was redispersed in ethyl acetate using sonication bath: Mv=157 nm, Mn=120 nm, 95% of particles 249 nm or smaller. A small amount of the solid was redispersed in water-saturated ethyl acetate and found to be stable for two months.

Example 3

This Example describes the surface modification of organic yellow pigment (PY 185) with polyethylene glycol (PEG-550) (Aldrich) by using the Mitsunobu reaction.

PY185 was dried at 120° C. for two hours prior to the reaction. Two 3-neck round bottom flasks with addition funnels and $N_2$ inlets were set up side by side. In flask 1, 8.88 g (44 mmol) DIAD dissolved in 50 g THF was charged to the addition funnel and 10.21 g (39 mmol) $Ph_3P$ dissolved in 50 g THF was charged to the flask and stirred vigorously using a mechanical stirrer (400 rpm). The intermediate was formed by dropwise addition of DIAD to $Ph_3P$ over 50 min. In flask 2, 14.3 g PY185 and a pre-prepared solution of 11 g (20 mmol) PEG-550 in 50 g THF were combined. The pigment and polymer mixture was stirred with a mechanical stirrer at 400 rpm for approximately 5 minutes. Once the addition of DIAD to $Ph_3P$ in flask 1 was complete, the mixture was added dropwise to the pigment/polymer mixture over 15 minutes. The mixture was stirred at room temperature under $N_2$ for two days. 100 mL ethyl acetate was added to the reaction vessel, followed by 2 mL 10% HCl. Material precipitated with a 50/50 (w/w) mixture of toluene and hexanes, then centrifuged at 3500 rpm for 10 minutes. Supernatant was decanted and discarded. Washed material in 50/50 ACN/butyl acetate and centrifuged for 2 h at 4400 rpm. The solvent was discarded and the cake dried at room temperature overnight in a forced air oven.

As disclosed herein, the terms "an organic group," "a nucleophile," "a polymer," "a pigment," and other such terms would be readily understood by one of ordinary skill in the art as referring to "at least one," as is consistent with chemical principles. Other embodiments of the claimed invention will be apparent to those skilled in the art from consideration of the present specification. It is intended that the present specification and examples be considered as exemplary only with a true scope and spirit of the invention being indicated by the following claims and equivalents thereof.

The invention claimed is:

1. A method of making a modified pigment, comprising:
   reacting, under Mitsunobu conditions:
   (a) a first reactant comprising a protonated nucleophile having a $pK_a<15$, and
   (b) a second reactant comprising a hydroxyl-containing organic group, wherein a pigment is attached to either the first or second reactant, and
   forming the modified pigment having attached an organic species comprising the nucleophile bonded to the organic group, with the net elimination of a proton and a hydroxyl.

2. The method of claim 1, wherein the pigment is attached to the first reactant.

3. The method of claim 1, wherein the protonated nucleophile is carboxylic acids, phenols, naphthols, or phthalimides.

4. The method of claim 1, wherein the hydroxyl-containing organic group is primary alcohols or secondary alcohols.

5. The method of claim 1, wherein the reactant not attached to the pigment comprises a polymer.

6. The method of claim 5, wherein the polymer is hydroxyl-containing polymers.

7. The method of claim 1, wherein the nucleophile is bonded to the organic group via linkages wherein the linkages are phenyl ester, phenyl ethers, naphthol esters, naphthol ethers, or phthalimides.

8. The method claim 1, wherein the Mitsunobu conditions includes reagents comprising:
   (a) trialkylphosphines or triarylphosphines, and
   (b) azodicarboxylate esters or azodicarboxylate amides.

9. The method of claim 1, wherein the pigment is carbon black pigments or organic pigments.

10. The method of claim 1, wherein the pigment is carbon black pigments and the protonated nucleophile is selected from phenols, naphthols, or carboxylic acids.

11. The method of claim 1, wherein the pigment is an organic pigment and the protonated nucleophile is phenols, naphthols, phthalimides, isoindoline, amides, or imides.

12. The method of claim 11, wherein the organic pigment is Pigment Yellow 185 or Pigment Red 269.

* * * * *